United States Patent
Bao et al.

(10) Patent No.: US 10,177,031 B2
(45) Date of Patent: Jan. 8, 2019

(54) SUBTRACTIVE ETCH INTERCONNECTS

(71) Applicant: International Business Machines Corporation, Armonk, NY (US)

(72) Inventors: Junjing Bao, San Diego, CA (US); Griselda Bonilla, Fishkill, NY (US); Samuel S. Choi, Hopewell Junction, NY (US); Ronald G. Filippi, Wappingers Falls, NY (US); Naftali E. Lustig, Croton-on-Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 14/580,259

(22) Filed: Dec. 23, 2014

(65) Prior Publication Data
US 2016/0181200 A1 Jun. 23, 2016

(51) Int. Cl.
*H01L 21/768* (2006.01)
*H01L 23/532* (2006.01)

(52) U.S. Cl.
CPC .. *H01L 21/76898* (2013.01); *H01L 21/76852* (2013.01); *H01L 21/76885* (2013.01); *H01L 23/53295* (2013.01); *H01L 23/53223* (2013.01); *H01L 23/53238* (2013.01); *H01L 23/53266* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,512,514 A | 4/1996 | Lee | |
| 5,872,062 A | 2/1999 | Hsu | |
| 6,040,243 A | 3/2000 | Li et al. | |
| 6,051,882 A | 4/2000 | Avanzino et al. | |
| 6,261,950 B1 | 7/2001 | Tobben et al. | |
| 6,465,343 B1 | 10/2002 | Wang | |
| 6,767,827 B1* | 7/2004 | Okada ............... | H01L 21/76808 257/E21.579 |

(Continued)

OTHER PUBLICATIONS

Besser, "Current Challenges with Copper Interconnects." ECS Transactions, vol. 2, No. 6, 2007, pp. 3-12.

(Continued)

*Primary Examiner* — Shaun M Campbell
*Assistant Examiner* — Aneta B Cieslewicz
(74) *Attorney, Agent, or Firm* — Steven J. Meyers; Hoffman Warnick LLC

(57) ABSTRACT

A method of forming an integrated metal line and interconnect. The method may include forming a first trench in a first ILD exposing a lower metal line, the first ILD is above a substrate, and the lower metal line is in the substrate; forming a first barrier layer in the first trench; forming an integrated metal layer (including a first metal line and a first via) on the first barrier layer; forming a first hardmask on the integrated metal layer; forming an isolation trench in the first hardmask and in the first metal line; forming a second barrier layer in the isolation trench; removing a portion of the second barrier layer from a bottom of the isolation trench exposing the first ILD; and forming a second ILD on the second barrier and in the isolation trench, where a bottom of the second ILD is in the first ILD.

10 Claims, 9 Drawing Sheets

(56) References Cited

U.S. PATENT DOCUMENTS

| | | | |
|---|---|---|---|
| 6,939,791 B2 | 9/2005 | Geffken et al. | |
| 7,449,409 B2 | 11/2008 | Barth et al. | |
| 7,544,609 B2 | 6/2009 | Angyal et al. | |
| 7,572,704 B2 | 8/2009 | Oh et al. | |
| 8,013,364 B2 | 9/2011 | Naujok et al. | |
| 8,357,609 B2 | 1/2013 | Ryan | |
| 8,492,270 B2 | 7/2013 | Ponoth et al. | |
| 8,728,906 B2 | 5/2014 | Chang et al. | |
| 8,735,278 B2 | 5/2014 | Lee et al. | |
| 8,765,595 B2 | 7/2014 | Cooney, III et al. | |
| 2006/0276028 A1* | 12/2006 | Park | H01L 21/76802 438/629 |
| 2007/0006451 A1* | 1/2007 | Lee | H01L 21/32139 29/825 |
| 2007/0259516 A1* | 11/2007 | Jahnes | H01L 21/7682 438/618 |
| 2013/0109148 A1 | 5/2013 | Oh et al. | |
| 2014/0021611 A1 | 1/2014 | Lee et al. | |
| 2014/0124932 A1* | 5/2014 | Tsai | H01L 23/53233 257/751 |
| 2014/0138797 A1 | 5/2014 | Cheng et al. | |
| 2014/0141578 A1 | 5/2014 | Brink et al. | |
| 2014/0151851 A1 | 6/2014 | Dunn et al. | |
| 2014/0183735 A1 | 7/2014 | Zhang et al. | |
| 2015/0129976 A1* | 5/2015 | Chang | H01L 21/28518 257/383 |

OTHER PUBLICATIONS

Collins, "Measuring and characterizing opaque multilayer metal film stacks on product wafers", MicroMagazine.com http://micromagazine.fabtech.org/archive/00/06/collins.html, accessed Aug. 26, 2014, pp. 1-15.

* cited by examiner

SUBTRACTIVE ETCH INTERCONNECTS

FIELD OF THE INVENTION

The present invention generally relates to semiconductor device manufacturing, and more particularly to the fabrication of metal interconnects.

BACKGROUND

Semiconductor devices are fabricated by sequentially depositing insulating (dielectric) layers, conductive layers and semiconductor layers of material over a semiconductor substrate, and patterning the various layers using lithography to form circuit components and elements thereon. A common conductive material used in the past for conductive lines was aluminum, which can be directly etched. However, as performance demands of integrated circuits ("ICs") continued, aluminum was lacking both because its resistivity became unacceptable, and the challenge of making smaller, reliable interconnects with aluminum.

Accordingly, aluminum interconnects were replaced with the lower resistivity copper. In contrast to aluminum, copper interconnects are made by a metal polishing process (dual damascene) rather than direct etching because (1) of copper corrosion during the etch process, and (2) the challenge of overlay of separate via, line lithography steps. However, as dimensions continue to shrink, especially as the 7 nm node approaches, filling aggressive dual damascene openings and the liner occupying much of the interconnect space compels a search for alternative methods of making interconnects.

SUMMARY

According to one embodiment of the present invention, a method is provided. The method may include forming a first trench in a first inter-layer dielectric (ILD) and a first cap, wherein the first cap is on a substrate and the first ILD is on the first cap, wherein the first trench exposes a lower metal line, and wherein the lower metal line is in the substrate; forming a first barrier layer on the first ILD and in the first trench; forming an integrated metal layer on the first barrier layer, wherein the integrated metal layer includes a first metal line and a first via, wherein the first metal line is above the first ILD and the first via is in the first trench, wherein the first metal line is in direct contact with the first via, and wherein a top surface of the integrated metal layer is planar; forming a first hardmask on the integrated metal layer; forming an isolation trench in the first hardmask and in the first metal line, wherein the isolation trench is not directly above the first via; forming a second barrier layer in the isolation trench; removing a portion of the second barrier layer from a bottom of the isolation trench exposing the first ILD; forming a second ILD on the second barrier and in the isolation trench, wherein a bottom of the second ILD is on the first ILD and below a top surface of the first ILD; and removing the second ILD and the second barrier layer from above the integrated metal layer.

According to another embodiment of the present invention, a method is provided. The method may include forming a first trench in a first dielectric layer, wherein the first dielectric layer is on a substrate, wherein the first trench exposes a lower metal line, and wherein the lower metal line is in the substrate; forming a first barrier layer on the first dielectric layer and in the first trench; forming an integrated metal layer on the first barrier layer, wherein the integrated metal layer includes a first metal line and a first via, wherein the first metal line is above the first dielectric layer and the first via is in the first trench, and wherein a top surface of the integrated metal layer is planar; forming a patterned first hardmask on the integrated metal layer; forming an isolation trench in the first metal line using the patterned first hardmask as a mask, wherein the patterned first hardmask defines a boundary of the isolation trench, wherein the isolation trench is not directly above the first via; forming a second barrier layer in the isolation trench; removing a portion of the second barrier layer from a bottom of the isolation trench exposing the first dielectric layer; forming a second inter-layer dielectric (ILD) on the second barrier and in the isolation trench, wherein a bottom of the second ILD is below a top surface of the first dielectric layer; and removing the second ILD and the second barrier layer from above the integrated metal layer.

According to another embodiment of the present invention, a structure is provided. The structure may include a substrate containing a lower metal line; a first inter-layer dielectric (ILD) on a first cap, wherein the first cap is on the substrate; an opening in the first ILD and the first cap that exposes a top surface of the lower metal line; a first barrier layer on a top surface of the first ILD and lining the opening, wherein the first barrier layer is in contact with the lower metal line; an integrated metal layer on the first barrier layer, wherein the integrated metal layer includes a first metal line above the first ILD and a first via in the opening, wherein there is no barrier between the first metal line and the first via, and wherein a top surface of the integrated metal layer is planar; and an isolation trench having, sidewalls of adjacent first metal lines of a same level, and a bottom in first ILD; wherein the isolation trench is filled with a second ILD, the second ILD in direct contact with the first ILD, and wherein a second barrier layer is in the isolation trench between the second ILD and the sidewall.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
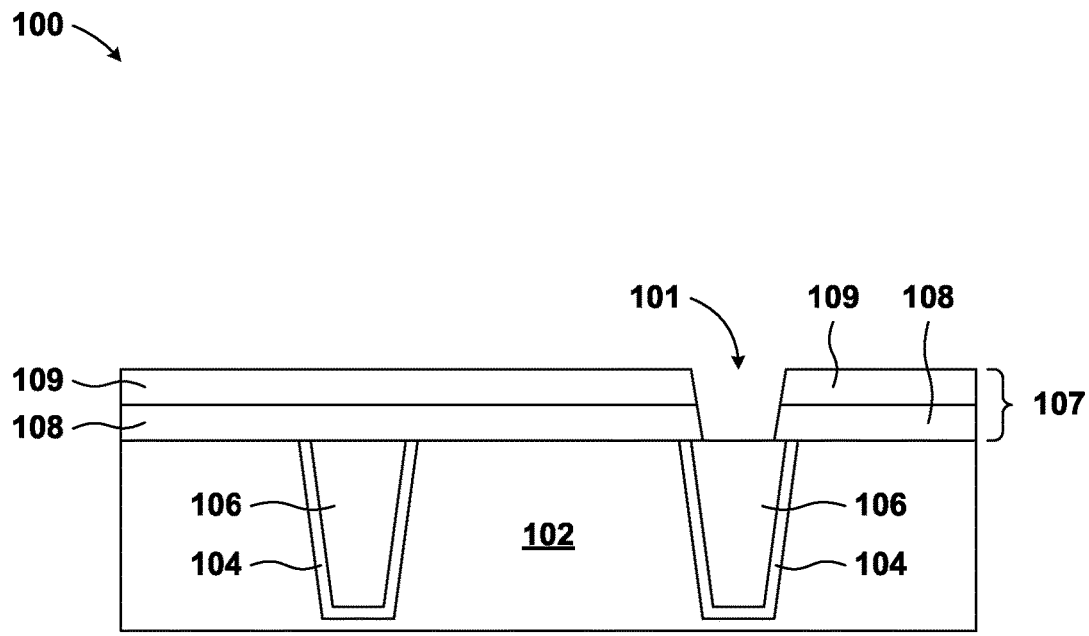
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the fabrication of metal interconnects using a combination of subtractive metal etch, reactive ion etching (RIE), polish and purge outgassing. Ideally, it may be desirable to form an integrated metal layer without etch contamination and with stable trench sidewalls. It should be noted, by "integrated metal layer," it is meant that a metal line and a via will not be separated by a barrier layer, but rather share a same bulk conductor and lower liner level in a continuous fashion. The purpose of using a subtractive etch to form an integrated metal layer may include forming a trench in a structurally stable material, such as copper, rather than in a less stable material, such as a dielectric. One embodiment by which to form an integrated metal layer using a subtractive etch is described in detail below with reference to the accompanying drawings FIGS. 1-11.

Referring now to FIG. 1, a structure 100 is illustrated during an intermediate step of a method of fabricating an integrated metal layer using a combination of a subtractive etch and a RIE. More specifically, the method can start with forming a first trench 101 through a first dielectric layer 107 exposing a lower metal line 106.

The lower metal line 106 may be in a substrate 102. The substrate 102 may include; a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors.

The lower metal line 106 may be formed in the substrate 102 using any metal formation technique known in the art, such as, for example, single or dual damascene. The lower metal line 106 may be any material known in the art, such as, for example, copper (Cu), aluminum (Al), or tungsten (W). In an embodiment, the lower metal line 106 is copper. The lower metal line 106 may be referred to as a metal line in the back-end-of-line (BEOL) but the lower metal line 106 may be in any layer and may be any conductive structure including a device contact. The lower metal line 106 may have a lower liner 104 between the lower metal line 106 and the substrate 102. The lower liner 104 may include any liner material known in the art, such as, for example, tantalum nitride and tantalum (TaN/Ta), titanium (Ta), titanium nitride (TaN), cobalt (Co), ruthenium (Ru), and/or manganese (Mn). The lower liner 104 may prevent diffusion of the lower metal line 106 into the substrate 102. The substrate 102, the lower liner 104, and the lower metal line 106 may be planarized using any method known in the art, such as, for example, chemical mechanical polishing (CMP).

The first trench 101 may be formed in the first dielectric layer 107 using any etching technique known in the art, such as, for example, a wet or dry etch. The first trench 101 may be formed by etching the first dielectric layer 107 selective to the lower metal line 106. In other words, the first dielectric layer 107 may be etched and the first metal line 106 may be used as an etch stop. The first trench 101 may extend from a top surface of the first dielectric layer 107 to a top surface of the lower metal line 106, such that the top surface of the lower metal line 106 is exposed.

In an embodiment, the first dielectric layer 107 may include a first cap 108 and a first inter-layer dielectric (ILD) 109. The first cap 108 may be directly on the substrate 102 and lower metal line 106. The first ILD 109 may be directly on the first cap 108.

The first cap 108 may be formed on a top surface of the substrate 102 using any deposition technique known in the art, such as, for example, chemical vapor deposition, plasma enhanced chemical vapor deposition, atomic layer deposition, or physical vapor deposition. The first cap 108 may include any dielectric material known in the art, such as, for example, silicon nitride ($Si_3N_4$), silicon carbide (SiC), silicon carbon nitride (SiCN), hydrogenated silicon carbide (SiCH), or other materials known in the art. In an embodiment, the first cap 108 is silicon nitride. The first cap 108 may have a thickness ranging from about 10 nm to about 55 nm and ranges there between, although a thickness less than 10 nm and greater than 55 nm may be acceptable.

The first ILD 109 may be formed on the first cap 108 using any deposition technique known in the art, such as, for example, chemical vapor deposition, plasma enhanced chemical vapor deposition, atomic layer deposition, or physical vapor deposition. The first ILD 109 may include any dielectric material, such as, for example, silicon nitride ($Si_3N_4$), silicon carbide (SiC), silicon carbon nitride (SiCN), hydrogenated silicon carbide (SiCH), or any other material known in the art. In an embodiment, the first ILD 109 is a different material than the first cap 108, which may provide etch selectivity (e.g., for etching of the first trench 101). The first ILD 109 may have a thickness ranging from about 10 nm to about 55 nm and ranges there between, although a thickness less than 10 nm and greater than 55 nm may be acceptable.

Figure 2:
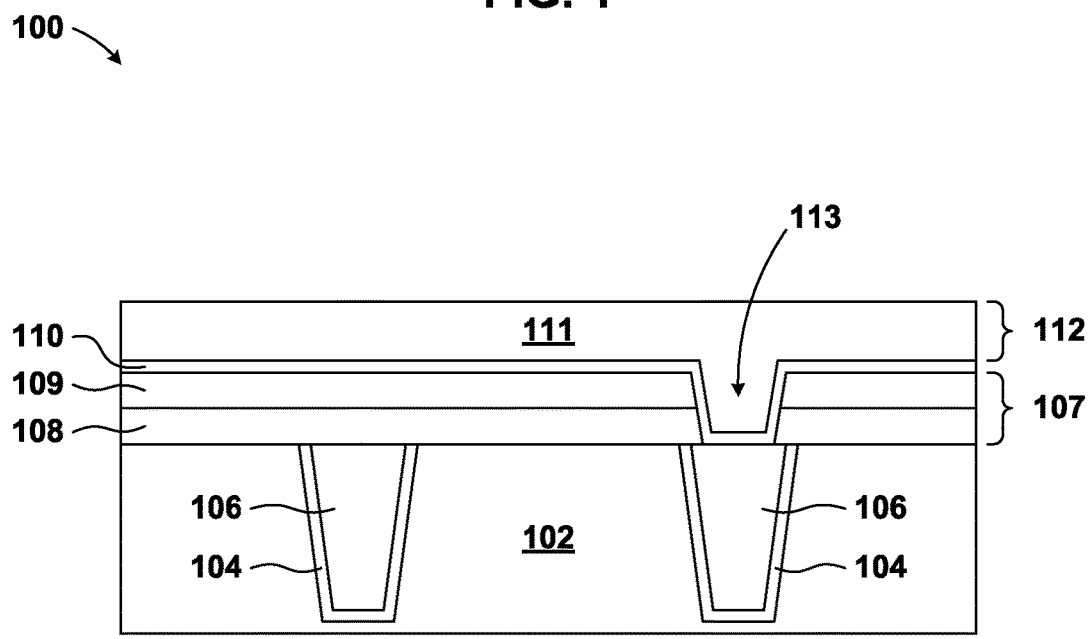
FIG. 2 is a cross section view of the semiconductor structure and illustrates the formation of an integrated metal layer on a first barrier layer.

Referring now to FIG. 2, the structure 100 is illustrated during an intermediate step of a method of fabricating an integrated metal layer 111 using a combination of a subtractive etch and a RIE. More specifically, the method can include forming a first barrier layer 110 and the integrated metal layer 111 on the first ILD 109 and in the first trench 101.

The first barrier layer 110 may be formed on the first ILD 109 and in the first trench 101 using any barrier deposition technique known in the art, such as, for example, chemical vapor deposition, plasma enhanced chemical vapor deposition, atomic layer deposition, or physical vapor deposition. The first barrier layer 110 may be any barrier material known in the art, such as, for example, tantalum/tantalum-nitride (Ta/TaN). The first barrier layer 110 may have a conformal thickness ranging from about 0.5 nm to about 10 nm and ranges there between, although a thickness less than 0.5 nm and greater than 10 nm may be acceptable.

The integrated metal layer 111 may be formed on the first barrier layer 110, preferably using a technique that largely fills from the bottom up, such as plating, and even more preferably, electro-plating, or any other technique may be used which forms a substantially planar top surface of the integrated metal layer 111. The integrated metal layer 111 may be any conductive material known in the art, such as, for example, copper, aluminum, or tungsten. In an embodiment, the integrated metal layer 111 may be copper.

The integrated metal layer 111 may include a first metal line 112 and a first via 113. By "integrated metal layer," it is meant that the first metal line 112 and the first via 113 share a same bulk conductor and lower liner level in a continuous fashion (i.e., there is no barrier between the first metal line 112 and the first via 113). The first via 113 may be a portion of the integrated metal layer 111 within the first trench 101 (described above). The first metal line 112 may be a portion of the integrated metal layer 111 above the first dielectric layer 107. The first metal line 112 may have a thickness of about 15 nm to about 75 nm and ranges there between, although a thickness less than 15 nm and greater than 75 nm may be acceptable.

Figure 3:
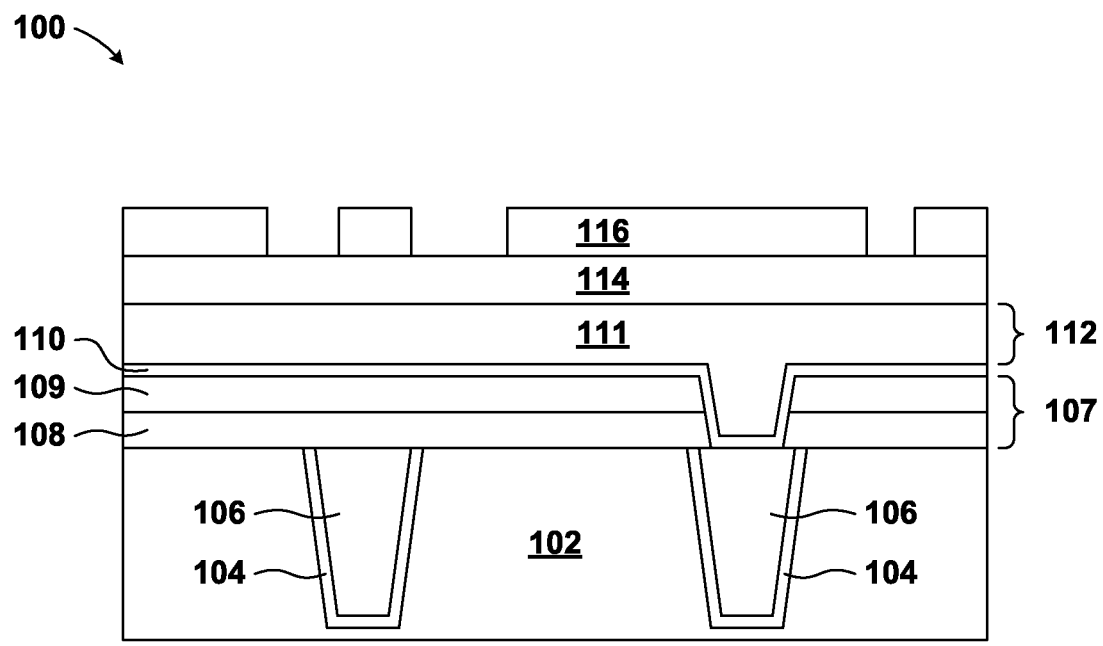
FIG. 3 is a cross section view of the semiconductor structure and illustrates the formation of a first hardmask on the integrated metal layer and a patterned second hardmask on the first hardmask.

Referring now to FIG. 3, the structure 100 is illustrated during an intermediate step of a method of fabricating the integrated metal layer 111 using a combination of a subtractive etch and a RIE. More specifically, the method can include forming and patterning a second hardmask 116 on a first hardmask 114.

The first hardmask 114 may be formed on the integrated metal layer 111 using any mask deposition technique known in the art, such as, for example, chemical vapor deposition, plasma enhanced chemical vapor deposition, atomic layer deposition, or physical vapor deposition. The first hardmask 114 may be any masking material known in the art, such as, for example, tantalum nitride, silicon dioxide, silicon nitride, or cobalt or Manganese oxide. In an embodiment the first hardmask 114 may be cobalt and/or manganese oxide and may serve as a permanent hardmask (i.e., cap) engineered to remain after a subsequent subtractive etch. In an alternative embodiment, the first hardmask 114 may be tantalum nitride. The first hardmask 114 may have a thickness of about 1 nm to about 50 nm and ranges there between, although a thickness less than 1 nm and greater than 50 nm may be acceptable.

The second hardmask 116 may be formed on the first hardmask 114 using any mask deposition technique known in the art, such as, for example, chemical vapor deposition, plasma enhanced chemical vapor deposition, atomic layer deposition, or physical vapor deposition. The second hardmask 116 may be any masking material known in the art, such as, for example, silicon dioxide, titanium nitride, or amorphous carbon. In an embodiment, the second hardmask 116 may be silicon dioxide. The second hardmask 116 may have a thickness of about 1 nm to about 50 nm and ranges there between, although a thickness less than 1 nm and greater than 50 nm may be acceptable. The second hardmask 116 may be patterned using any patterning techniques known in the art, such as, for example, line lithography including a photoresist material.

Figure 4:
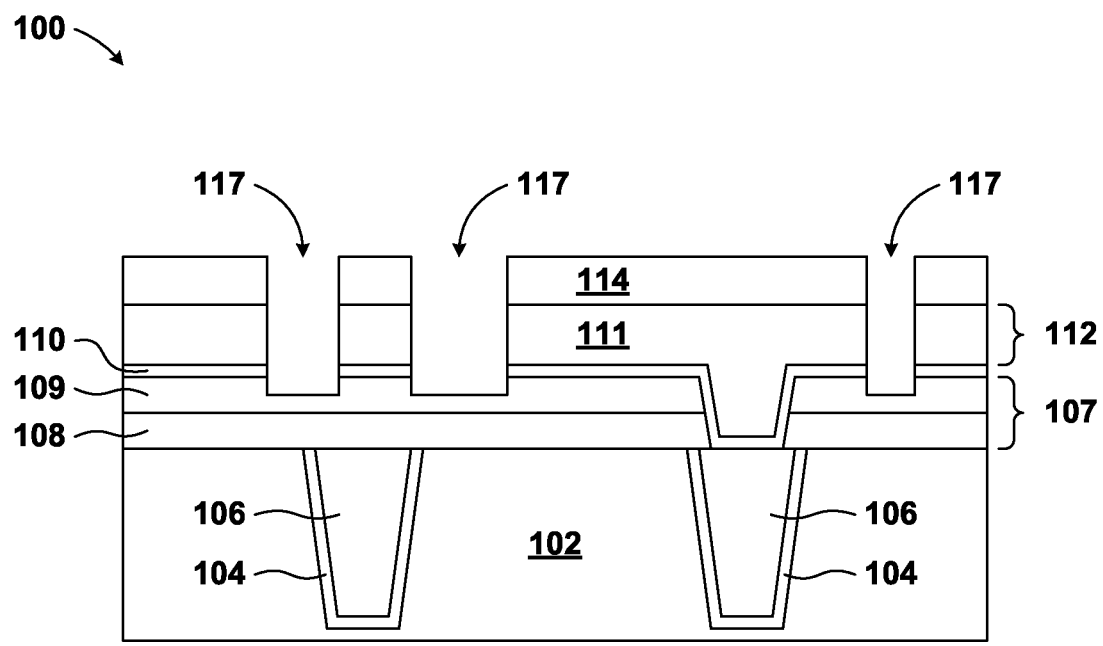
FIG. 4 is a cross section view of the semiconductor structure and illustrates the formation of an isolation trench extending from the first hardmask into a first inter-layer dielectric (ILD).

Referring now to FIG. 4, the structure 100 is illustrated during an intermediate step of a method of fabricating the integrated metal layer 111 using a combination of a subtractive etch and a RIE. More specifically, the method can include forming an isolation trench 117 through the first hardmask 114, the first metal line 112, the first barrier layer 110, and into the first ILD 109.

The isolation trench 117 may be formed through the first hardmask 114, the first metal line 112, the first barrier layer 110, and into the first ILD 109 using any etching techniques known in the art, such as, for example, a dry etch process. The isolation trench 117 may be formed by etching the first hardmask 114, the first metal line 112, the first barrier layer 110, and a portion of the first ILD 109, while using the second hardmask 116 as a mask. The depth of the isolation trench 117 may be controlled by controlling an etching depth into the first ILD 109. The controllability of the depth of the isolation trench 117 may help with time-dependent dielectric breakdown (TDDB) for device formation. Specifically, a bottom of the isolation trench 117 may penetrate 10% or more into the first ILD 109 which can inhibit dielectric breakdown between adjacent metal lines of the same level. Preferably, the bottom of the isolation trench 117 penetrates from about 10% to about 50% of the first ILD 109 and ranges therebetween. In an embodiment, the second hardmask 116 is removed during the formation of the isolation trench 117 and the first hardmask 114 remains on the integrated metal layer 111.

During the formation of the isolation trench 117 corrosive chemicals or oxidation may contaminant the integrated metal layer 111 during the subtractive etch. For example, a chlorine solution may be used during the etching process and the chlorine may diffuse into any exposed surfaces of the integrated metal layer 111. One benefit to using a first hardmask 114 and a second hardmask 116 may be to prevent the contamination and diffusion of the etching solution on a top surface of the integrated metal layer 111 by using the first hardmask 114 as a diffusion barrier. For example, the second hardmask 116 may be used to define horizontal dimensions of the isolation trench 117 and be removed during the isolation trench 117 formation, and the first hardmask 114 may act as a diffusion barrier during the isolation trench 117 formation. A cleaning step may be performed, after the formation of the isolation trench 117, to remove any contaminants. The cleaning step may include, for example, a post chlorine RIE argon purge to outgas corrosive chemistries and/or reduce oxidation at atmospheric pressure.

Figure 5A:
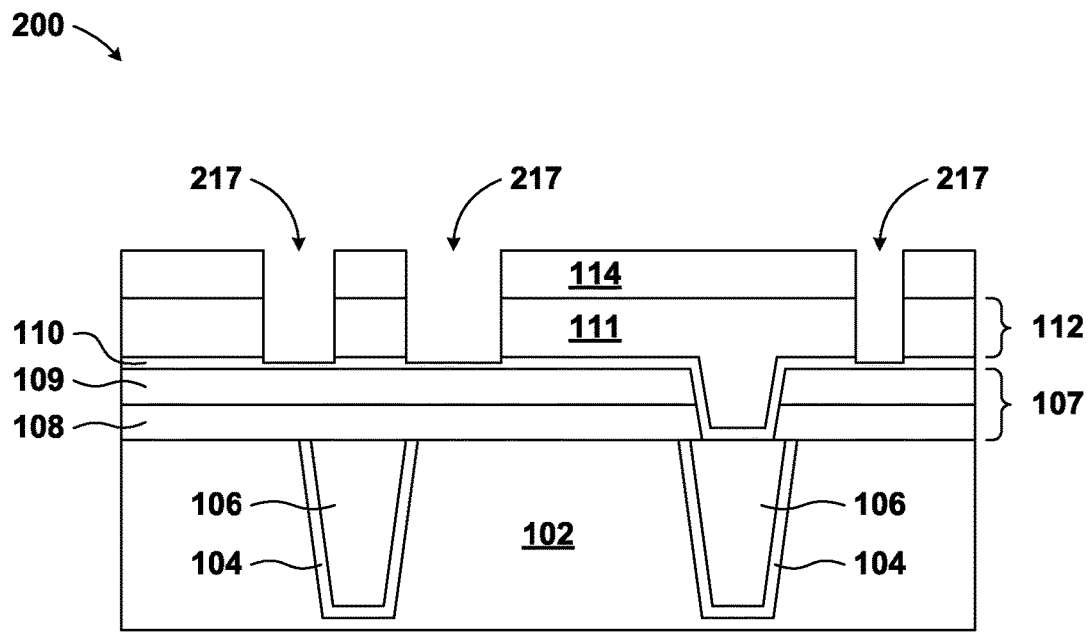
FIG. 5a is a cross section view of an alternative semiconductor structure and illustrates the formation of an alternative isolation trench extending from the first hardmask to a first barrier layer.
Figure 5B:
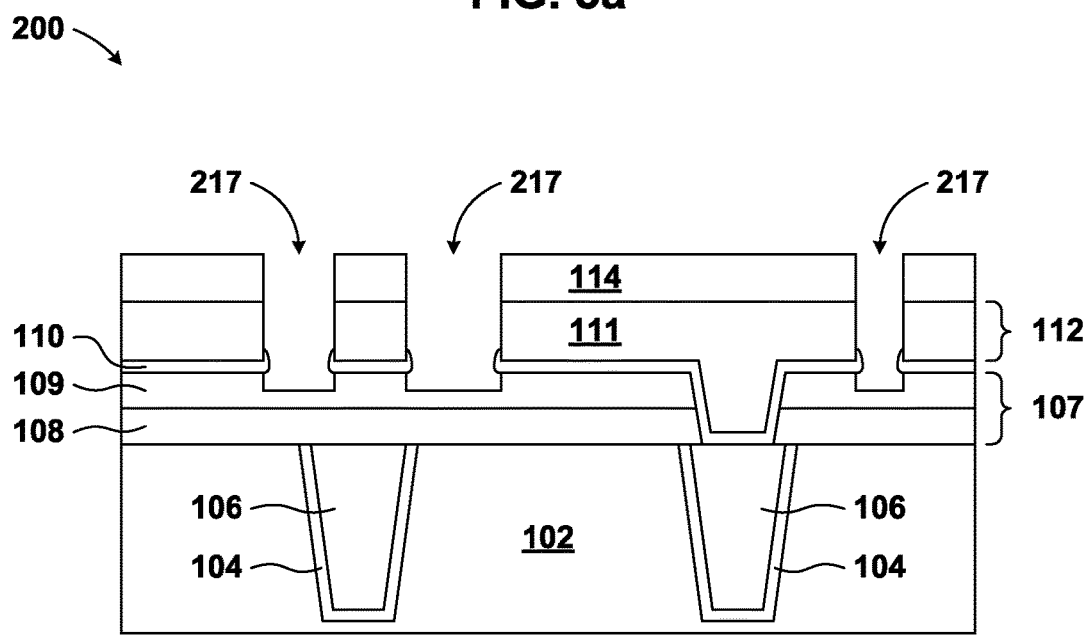
FIG. 5b is a cross section view of the alternative semiconductor structure and illustrates the formation of the alternative isolation trench extending through the first barrier layer.

Referring now to FIGS. 5a and 5b, an alternative structure 200 is illustrated during an intermediate step of a method of fabricating the integrated metal layer 111 using a combination of a subtractive etch and a RIE. More specifically, the method can include forming an alternative isolation trench 217 through the first hardmask 114, the first metal line 112, the first barrier layer 110, and into the first ILD 109. It should be noted, FIG. 5b is an alternative embodiment of the structure 100 illustrated in FIG. 4, and subsequent processing steps may be similar.

In the alternative embodiment, the alternative isolation trench 217 may be formed by etching the first hardmask 114 and the first metal line 112, while using the second hardmask 116 (illustrated in FIG. 3) as a mask and the first barrier layer 110 as an etch stop. An opening may be formed in the first barrier layer 110 using any material removal technique known in the art, such as, for example, an argon sputtering technique. The sputtering process may push a portion of the first barrier layer 110 that is in the alternative isolation trench 217 to trench sidewalls of the alternative isolation trench 217. The alternative isolation trench 217 may be further deepened by etching a portion of the first ILD 109. The alternative isolation trench 217 may extend 10% to 50% into the first ILD 109, similar to the isolation trench 117 described with reference to FIG. 4.

Figure 6:
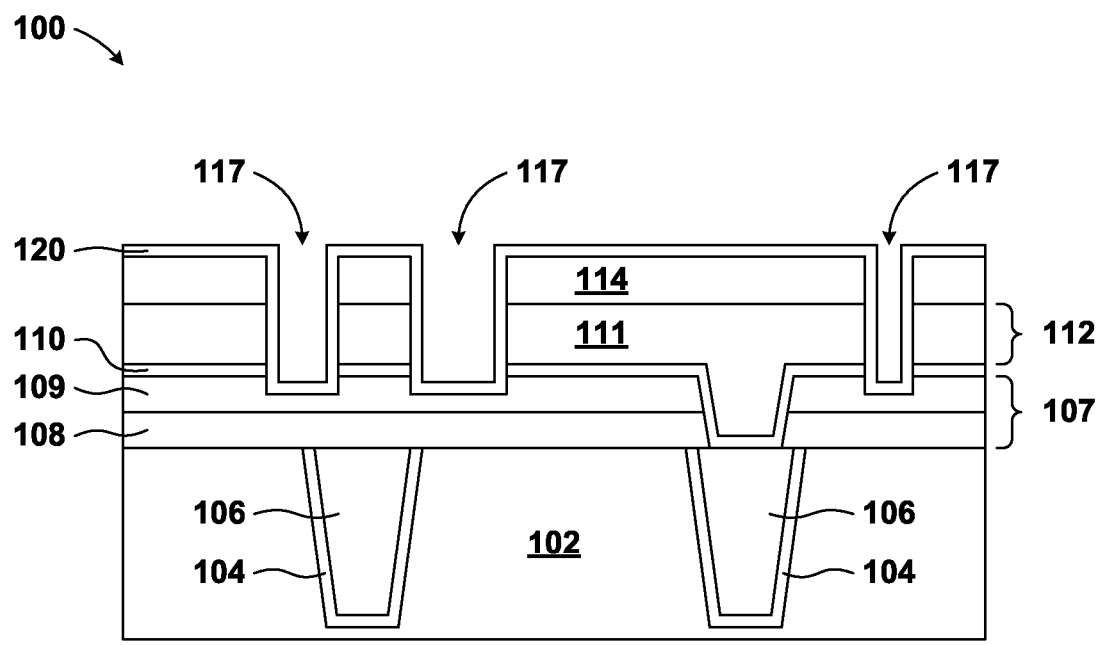
FIG. 6 is a cross section view of the semiconductor structure and illustrates the formation of a second barrier layer on the first hardmask and in the isolation trench.

Referring now to FIG. 6, the structure 100 is illustrated during an intermediate step of a method of fabricating the integrated metal layer 111 using a combination of a subtractive etch and a RIE. More specifically, the method can include forming a second barrier layer 120 on the first hardmask 114 and in the isolation trench 117. It should be noted, FIGS. 6-11 follow the embodiment illustrated in FIG. 4, but alternative embodiments (e.g., structure 200) may use similar processing steps.

The second barrier layer 120 may be formed directly on the first hardmask 114 and in the isolation trench 117 using any barrier formation technique known in the art, such as, for example, chemical vapor deposition, plasma enhanced chemical vapor deposition, atomic layer deposition, or physical vapor deposition. A bottom portion of the second barrier layer 120 may be directly on the first ILD 109. Sidewall portions of the second barrier layer 120 may be on sidewalls of the isolation trench 117 (i.e., on sidewalls of the first metal line 112). The plane where the second barrier layer 120 and the first ILD 109 contact, may be 10% to 50% below the top surface of the first ILD 109. The second barrier layer 120 may be a metallic material including, for example, tantalum nitride, titanium nitride, cobalt, and/or Ruthenium. The second barrier layer 120 may have a conformal thickness ranging from about 0.1 nm to about 7 nm and ranges there between, although a thickness less than 0.1 nm and greater than 7 nm may be acceptable. A benefit of including a metallic material in the second barrier layer 120 may include, for example, preventing interaction and/or oxidation of the conductive material from subsequent processing, such as, dielectric deposition.

Figure 7:
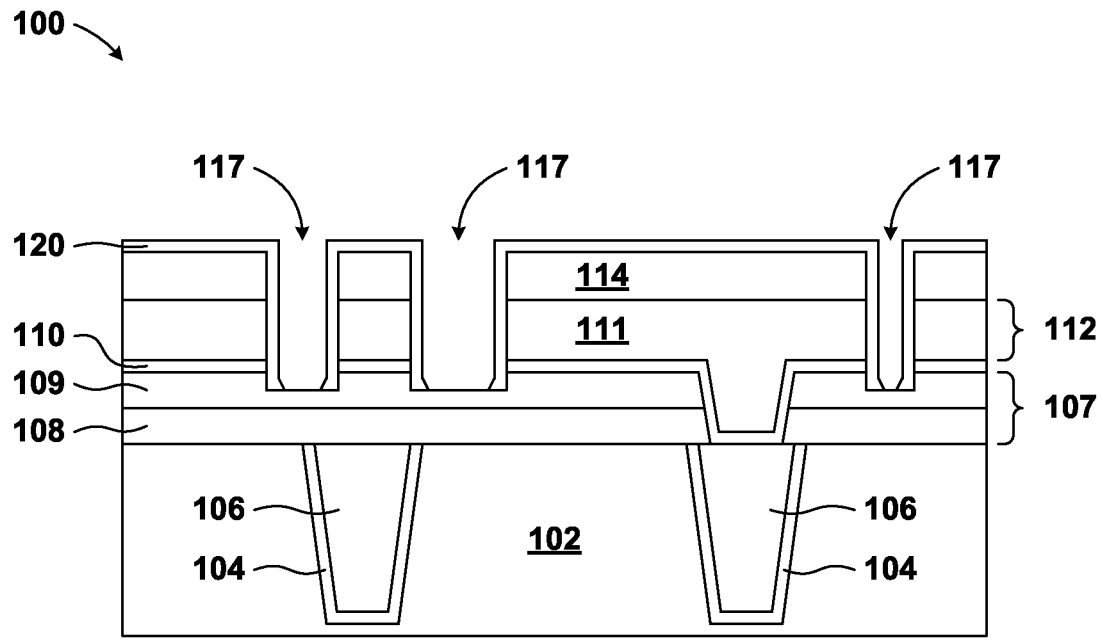
FIG. 7 is a cross section view of the semiconductor structure and illustrates the removal of a bottom portion of the second barrier layer in the isolation trench.

Referring now to FIG. 7, the structure 100 is illustrated during an intermediate step of a method of fabricating the integrated metal layer 111 using a combination of a subtractive etch and a RIE. More specifically, the method can include isolating portions of the second barrier layer 120.

The bottom portion of the second barrier layer 120 may be removed using any material removal technique known in the art, such as, for example, a sputtering process. The purpose of removing the bottom portion of the second barrier layer 120 may include disconnecting portions of the second barrier layer 120 from one another. It may be desirable to disconnect portions of the second barrier layer 120 because the second barrier layer 120 may include conductive materials, as described above. A portion of the first ILD 109 may be exposed at a bottom of the isolation trench 117. The exposed portion of the first ILD 109 may be 10% to 50% below the top surface of the first ILD 109.

Figure 8:
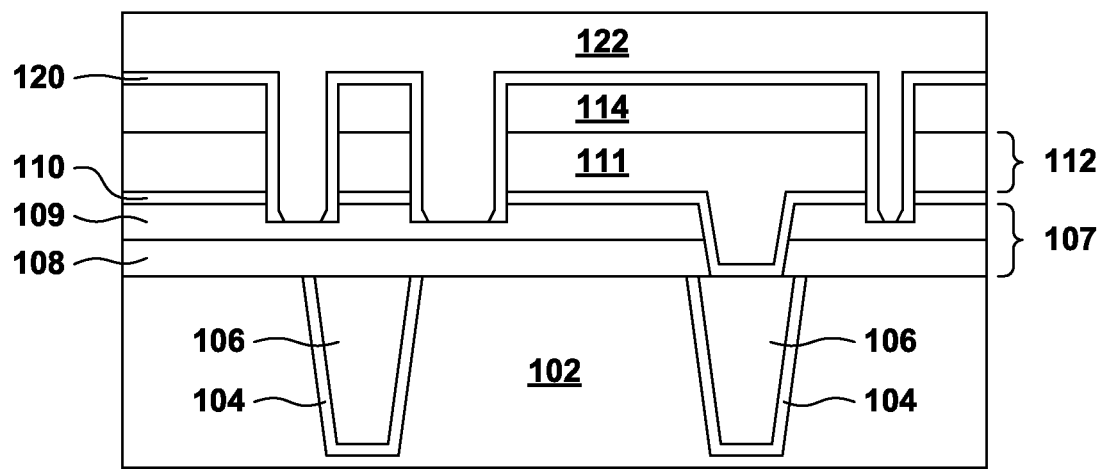
FIG. 8 is a cross section view of the semiconductor structure and illustrates the formation of a second ILD on the second barrier layer and in the isolation trench.

Referring now to FIG. 8, the structure 100 is illustrated during an intermediate step of a method of fabricating the integrated metal layer 111 using a combination of a subtractive etch and a RIE. More specifically, the method can include forming a second ILD 122 on the second barrier layer 120 and in the isolation trench 117.

The second ILD 122 may be formed on the second barrier layer 120 using any deposition technique known in the art, such as, for example, chemical vapor deposition, plasma enhanced chemical vapor deposition, atomic layer deposition, or physical vapor deposition. The second ILD 122 may be in the isolation trench 117 and may be formed on the exposed portion of the first ILD 109. The second ILD 122 may include any dielectric material, such as, for example, silicon nitride ($Si_3N_4$), silicon carbide (SiC), silicon carbon nitride (SiCN), hydrogenated silicon carbide (SiCH), or any other material known in the art.

Figure 9:
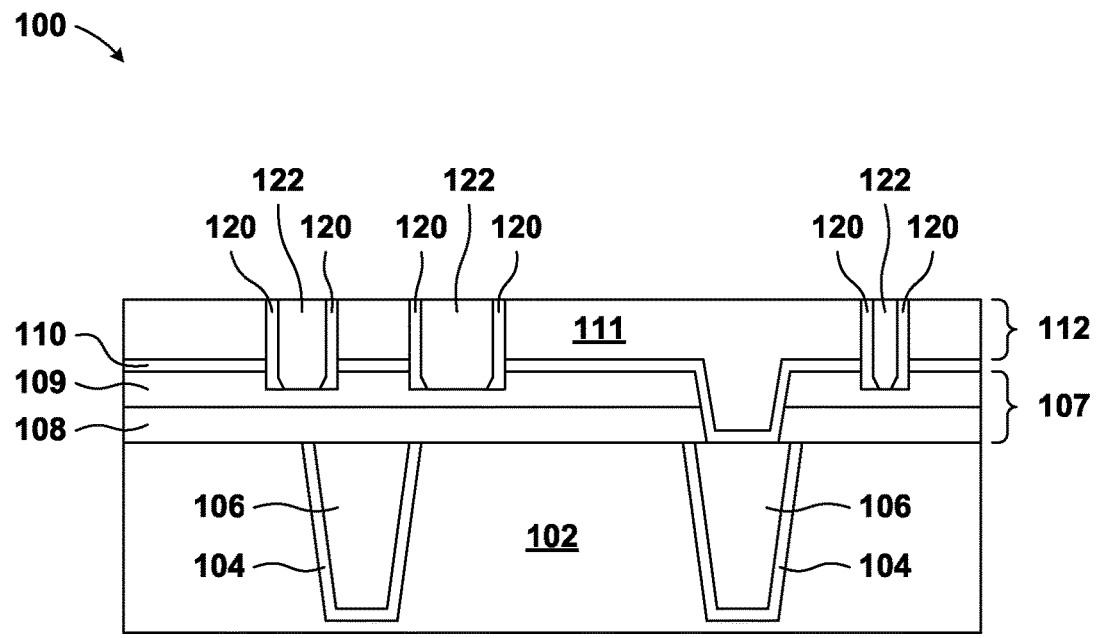
FIG. 9 is a cross section view of the semiconductor structure and illustrates the removal of the second barrier layer and the second ILD from above the integrated metal layer.

Referring now to FIG. 9, the structure 100 is illustrated during an intermediate step of a method of fabricating the integrated metal layer 111 using a combination of a subtractive etch and a RIE. More specifically, the method can include removing a portion of the second ILD 122 and a portion of the second barrier layer 120 from above the integrated metal layer 111.

A portion of the second ILD 122 and a portion of the second barrier layer 120 may be removed from above the integrated metal layer 111 using any removal technique known in the art, such as, for example, a chemical mechanical polish (CMP) process. The CMP process may also remove hardmask 114 as shown in FIG. 9.The removed portion of the second barrier layer 120 may disconnect lateral portions of the second barrier layer 120 on sidewalls of the first metal line 112. The second ILD 122, the second barrier layer 120 and the integrated metal layer 111 may have a coplanar top surface.

Figure 10:
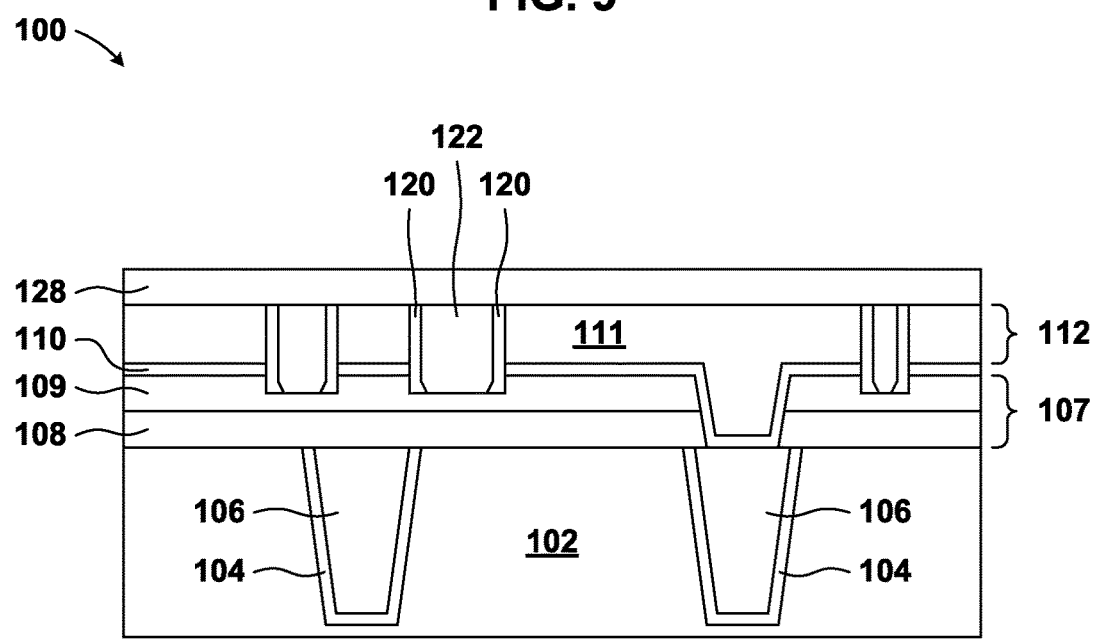
FIG. 10 is a cross section view of the semiconductor structure and illustrates the formation of a second cap directly on the integrated metal layer.

Referring now to FIG. 10, the structure 100 is illustrated during an intermediate step of a method of fabricating the integrated metal layer 111 using a combination of a subtractive etch and a RIE. More specifically, the method can include forming a second cap 128 on the coplanar top surface of the second ILD 122, the second barrier layer 120 and the integrated metal layer 111.

The second cap 128 may be formed on the second ILD 122, the second barrier layer 120 and the integrated metal layer 111 using any deposition technique known in the art, such as, for example, chemical vapor deposition, plasma enhanced chemical vapor deposition, atomic layer deposition, or physical vapor deposition. The second cap 128 may include any dielectric material known in the art, such as, for example, silicon nitride ($Si_3N_4$), silicon carbide (SiC), silicon carbon nitride (SiCN), hydrogenated silicon carbide (SiCH), or any other material known in the art. In an embodiment, the second cap 128 is silicon nitride. The second cap 128 may have a thickness ranging from about 10 nm to about 55 nm and ranges there between, although a thickness less than 10 nm and greater than 55 nm may be acceptable.

Figure 11:
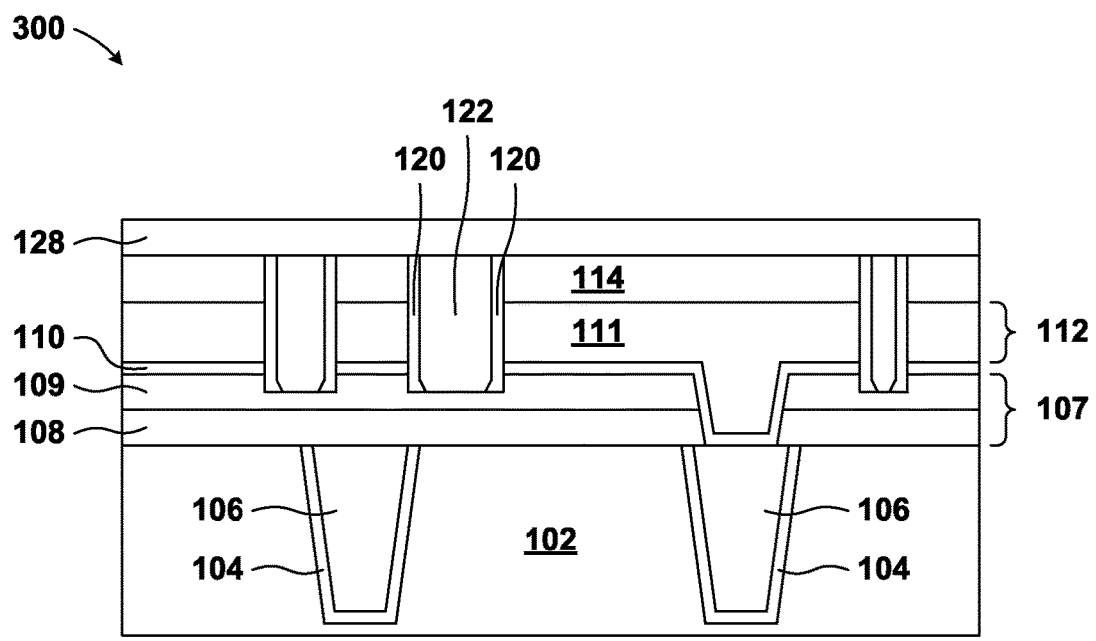
FIG. 11 is a cross section view of the alternative semiconductor structure and illustrates the formation of the second cap directly on the first hardmask.

Referring now to FIG. 11, an alternative structure 300 is illustrated during an intermediate step of a method of fabricating the integrated metal layer 111 using a combination of a subtractive etch and a RIE. More specifically, the method can include forming the second cap 128 directly on a coplanar surface of the second ILD 122, the second barrier layer 120 and the first hardmask 114. In this embodiment, the first hardmask 114 remains on the integrated metal layer 111, such that the first hardmask 114 is between the second cap 128 and the integrated metal layer 111.

Figure 12:
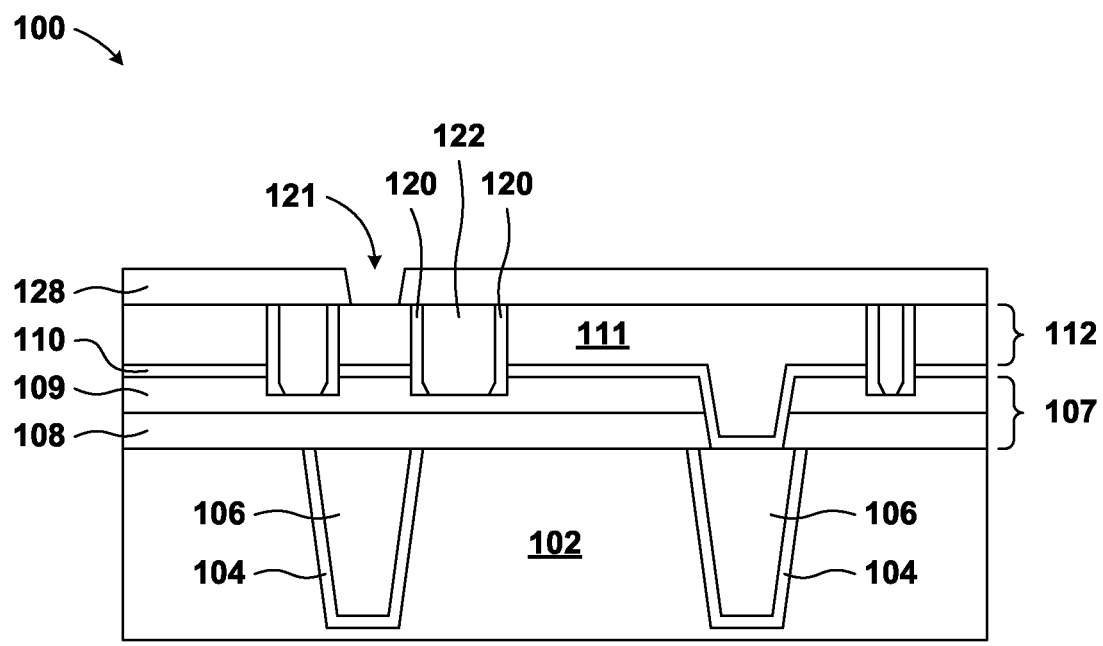
FIG. 12 is a cross section view of the semiconductor structure and illustrates the formation of a second trench in the second cap.

Referring now to FIG. 12, the structure 100 is illustrated during an intermediate step of a method of fabricating the integrated metal layer 111 using a combination of a subtractive etch and a RIE. More specifically, the method can include forming a second trench 121 in the second cap 128.

The second trench 121 may be formed above a portion of the integrated metal layer 111, such that the integrated metal layer 111 is exposed by the second trench 121. Similar process steps, as described with reference to FIGS. 1-10b may be repeated to form a second metal layer having a second metal line and a second via. In other words, the second cap 128 may be similar to the first dielectric layer 107.

A benefit of the described embodiments may include the ability to scale down the manufacturing of semiconductor devices by using subtractive etching which may be more stable when forming thinner lines. An embodiment having a recessed second ILD 122 (e.g., where the second ILD 122 extends below a bottom surface of the first metal line 112) may mitigate time-dependent dielectric breakdown (TDDB) failures. An embodiment having a permanent first hardmask 114 may allow for protection against diffusion or contamination at a top surface of the integrated metal layer 111 during the subtractive etching process. The first hardmask 114 may help define the isolation trench 117 and any alternative isolation trench. An embodiment that utilizes the argon purge may minimize interconnect degradation from patterning and/or etching. The first and second barrier layers 110 and 120 may act as diffusion and/or isolation barriers for between metal layers.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a first trench in a first inter-layer dielectric (ILD) and a first cap, wherein the first cap is on a substrate and the first ILD is on the first cap, wherein the first trench exposes a lower metal line, and wherein the lower metal line is in the substrate;
   forming a first barrier layer on the first ILD and in the first trench;
   forming an integrated metal layer on the first barrier layer, wherein the integrated metal layer includes a first metal line and a first via, wherein the first metal line is above the first ILD and the first via is in the first trench, wherein the first metal line is in direct contact with the first via, and wherein a top surface of the integrated metal layer is planar;
   forming a first hardmask on the integrated metal layer;
   forming an isolation trench in the first hardmask and in the first metal line, wherein the isolation trench is not directly above the first via, and wherein the isolation trench extends at least partially into the first ILD;
   forming a second barrier layer in the isolation trench, such that the second barrier layer extends at least partially into the first ILD;
   removing a portion of the second barrier layer from a bottom of the isolation trench to expose the first ILD;
   forming a second ILD on the second barrier and in the isolation trench, wherein a bottom surface of the second ILD is on the first ILD, and the bottom surface of the second ILD being below a top surface of the first ILD and below the first metal line; and
   removing the second ILD and the second barrier layer from above the integrated metal layer,
   wherein the first hardmask is formed between a top portion of the second barrier layer and the integrated metal layer, and the first hardmask is a diffusion barrier.

2. The method of claim 1, wherein a portion of the second ILD in the isolation trench extends 10 to 50 percent into the first ILD.

3. The method of claim 1, further comprising:
   removing the first barrier layer from a bottom surface of the isolation trench using a sputtering process; and
   removing a portion of the first ILD at the bottom of the isolation trench.

4. The method of claim 1, wherein the second barrier layer is a metallic material.

5. The method of claim 1, further comprising:
   forming a second cap on the second ILD and above the first metal layer;
   forming a second trench in the second cap, wherein a portion the integrated metal layer is exposed; and
   forming a second integrated metal layer on the second cap and in the second trench, wherein the second integrated metal layer includes a second metal line and a second via, wherein the second metal line is above the second ILD and the second via is in the second trench, and wherein a top surface of the second integrated metal layer is planar.

6. A method comprising:

forming a first trench in a first dielectric layer, wherein the first dielectric layer is on a substrate, wherein the first trench exposes a lower metal line, and wherein the lower metal line is in the substrate;

forming a first barrier layer on the first dielectric layer and in the first trench;

forming an integrated metal layer on the first barrier layer, wherein the integrated metal layer includes a first metal line and a first via, wherein the first metal line is above the first dielectric layer and the first via is in the first trench, and wherein a top surface of the integrated metal layer is planar;

forming a patterned first hardmask on the integrated metal layer;

forming an isolation trench in the first metal line using the patterned first hardmask as a mask, wherein the patterned first hardmask defines a boundary of the isolation trench, wherein the isolation trench is not directly above the first via, and wherein the isolation trench extends at least partially into the first dielectric layer;

forming a second barrier layer in the isolation trench, such that the second barrier layer extends at least partially into the first dielectric layer;

removing a portion of the second barrier layer from a bottom of the isolation trench to expose the first dielectric layer;

forming an inter-layer dielectric (ILD) on the second barrier and in the isolation trench, wherein a bottom surface of the ILD is below a top surface of the first dielectric layer; and removing the ILD and the second barrier layer from above the integrated metal layer, wherein the first hardmask is formed between a top portion of the second barrier layer and the integrated metal layer, and the first hardmask is a diffusion barrier.

7. The method of claim 6, wherein a portion of the ILD in the isolation trench extends 10 to 50 percent into the first dielectric layer.

8. The method of claim 6, further comprising:

removing the first barrier layer from a bottom surface of the isolation trench using a sputtering process; and removing a portion of the first dielectric layer at the bottom of the isolation trench.

9. The method of claim 6, wherein the first via is in direct contact with the first metal line.

10. The method of claim 6, further comprising:

forming a cap on the ILD and above the first metal layer;

forming a second trench in the cap, wherein a portion the integrated metal layer is exposed; and forming a second integrated metal layer on the cap and in the second trench, wherein the second integrated metal layer includes a second metal line and a second via, wherein the second metal line is above the ILD and the second via is in the second trench, and wherein a top surface of the second integrated metal layer is planar.

* * * * *